United States Patent
Kondo et al.

(10) Patent No.: US 10,781,108 B2
(45) Date of Patent: Sep. 22, 2020

(54) SHEET CONTAINING TWO-DIMENSIONAL HYDROGEN BORIDE AND PRODUCTION METHOD FOR SHEET CONTAINING TWO-DIMENSIONAL BORON COMPOUND

(71) Applicants: University of Tsukuba, Tsukuba-shi, Ibaraki (JP); Tokyo Institute of Technology, Meguro-ku, Tokyo (JP)

(72) Inventors: Takahiro Kondo, Tsukuba (JP); Junji Nakamura, Tsukuba (JP); Hiroaki Nishino, Shunan (JP); Asahi Fujino, Okayama (JP); Tomohiro Fujimori, Tokyo (JP); Hideo Hosono, Tokyo (JP); Masahiro Miyauchi, Tokyo (JP)

(73) Assignees: University of Tsukuba, Tsukuba-shi, Ibaraki (JP); Tokyo Institute of Technology, Meguro-ku, Tokyo (JP)

( * ) Notice: Subject to any disclaimer, the term of this patent is extended or adjusted under 35 U.S.C. 154(b) by 0 days.

(21) Appl. No.: 16/342,178

(22) PCT Filed: Oct. 18, 2017

(86) PCT No.: PCT/JP2017/037709
§ 371 (c)(1),
(2) Date: Apr. 15, 2019

(87) PCT Pub. No.: WO2018/074518
PCT Pub. Date: Apr. 26, 2018

(65) Prior Publication Data
US 2019/0315628 A1    Oct. 17, 2019

(30) Foreign Application Priority Data
Oct. 18, 2016    (JP) .................................. 2016-204477

(51) Int. Cl.
| | | |
|---|---|---|
| C01B 35/04 | (2006.01) | |
| C01B 6/00 | (2006.01) | |
| H01M 4/58 | (2010.01) | |
| H01M 10/0525 | (2010.01) | |
(Continued)

(52) U.S. Cl.
CPC ............... C01B 35/04 (2013.01); C01B 6/00 (2013.01); H01M 4/58 (2013.01); H01M 10/0525 (2013.01); B01J 31/146 (2013.01); C01P 2002/74 (2013.01); C01P 2002/76 (2013.01); C01P 2002/85 (2013.01);
(Continued)

(58) Field of Classification Search
CPC ...................................................... C01B 35/04
USPC ........................................................ 428/220
See application file for complete search history.

(56) References Cited

U.S. PATENT DOCUMENTS

2014/0349854 A1* 11/2014 Miura .................... H01B 12/02
505/100

OTHER PUBLICATIONS

Jiao, Y., et al., "Two-Dimensional Boron Hydride Sheets: High Stability, Massless Dirac Fermions, and Excellent Mechanical Properties," Angewandte Chemie International Edition 55(1): 10292-10295,2016. (Year: 2016).*

(Continued)

*Primary Examiner* — Brent T O'Hern
(74) *Attorney, Agent, or Firm* — Christensen O'Connor Johnson Kindness PLLC (57) ABSTRACT

A two-dimensional hydrogen boride-containing sheet of the present invention has a two-dimensional network that consists of $(HB)_n$ ($n \geq 4$).

6 Claims, 12 Drawing Sheets

(51) Int. Cl.
*B01J 31/14* (2006.01)
*H01L 39/12* (2006.01)

(52) U.S. Cl.
CPC ...... *C01P 2004/03* (2013.01); *C01P 2004/24* (2013.01); *C01P 2006/40* (2013.01); *H01L 39/12* (2013.01)

(56) References Cited

OTHER PUBLICATIONS

Abtew, T.A., et al., "Prediction of a Multicenter-Bonded Solid Boron Hydride for Hydrogen Storage," Physical Review B 83(9):094108.1-094108.6, Mar. 2011.
International Search Report and Written Opinion dated Jan. 16, 2018, issued in corresponding International Application No. PCT/JP2017/037709, filed Oct. 18, 2017, 4 pages.
Jiang, H.R., et al., "Borophene: A Promising Anode Material Offering High Specific Capacity and High Rate Capability for Lithium-Ion Batteries," Nano Energy 23:97-104, 2016.
Jiao, Y., et al., "Two-Dimensional Boron Hydride Sheets: High Stability, Massless Dirac Fermions, and Excellent Mechanical Properties," Angewandte Chemie International Edition 55(1):10292-10295, 2016.
Penev, E.S., et al., "Can Two-Dimensional Boron Superconduct?" Nano Letters 16:2522-2526, 2016.
Q, P., et al., "Mechanical Properties and Stabilities of α-Boron Monolayers," Physical Chemistry Chemical Physics 17(3):2160, 2015, 11 pages.
Wang, J., et al., "Boron-Double-Ring Sheet, Fullerene, and Nanotubes:Potential Hydrogen Storage Materials," ChemPhysChem 15(16):3453-3459, Nov. 2014.
Xu, J., et al., "Ultrathin Nanosheets: Ultrathin Single-Crystalline Boron Nanosheets for Enhanced Electro-Optical Performances," Advanced Science 2:1500023, 2015, 11 pages.
Extended European Search Report dated Mar. 17, 2020, issued in corresponding Application No. EP17862010.0, filed Oct. 18, 2017, 8 pages.
Feng, B., et al., "Experimental Realization of Two-Dimensional Boron Sheets," Nature Chemistry 8(6):563-568, Jun. 2016.
Mannix, A.J., et al.,"Synthesis of Borophenes: Anisotropic, Two-Dimensional Boron Polymorphs", Science 350(6267):1513-1516, Dec. 2015.
Severa, G., et al., "Direct Hydrogenation of Magnesium Boride to Magnesium Borohydride: Demonstration of >11 Weight Percent Reversible Hydrogen Storage," Chemical Communications 46(3):421-423, Oct. 2009.

* cited by examiner

SHEET CONTAINING TWO-DIMENSIONAL HYDROGEN BORIDE AND PRODUCTION METHOD FOR SHEET CONTAINING TWO-DIMENSIONAL BORON COMPOUND

TECHNICAL FIELD

The present invention relates to a two-dimensional hydrogen boride-containing sheet and a production method for a two-dimensional boron compound-containing sheet.

BACKGROUND ART

In recent years, a phenomenon with novel functionalities involved has been found for substances in which atoms form a two-dimensional network (hereinafter referred to as "atomic network substances"). In addition, the atomic network substances have attracted attention for their potential as functional materials. Although not sufficiently developed, the potential of the atomic network substances may be considered superior to other materials. As the potential of the atomic network substances which is superior to other materials, for example, creation and control of functions by insertion of metal atoms into the atomic networks, selection thereof, or the like, flexibility of the atomic networks, a function as catalyst carriers or catalysts utilizing a wide specific surface area, high functionality inherent in the atomic networks, and the like are mentioned.

In addition, the atomic network substances form a matrix of a metal, a semiconductor, or an insulator by a network structure. Insertion of metal atoms into the atomic networks causes charge transfer, which makes it possible to control electronic properties. Graphene in which only carbon atoms form a two-dimensional network has better electrical conductivity than silicon and better strength than iron. In addition, graphene is expected to be applied in various fields including semiconductor materials and electrode materials for secondary batteries. In addition, a two-dimensional boron sheet in which boron atoms form a two-dimensional network is also expected to have similar properties to graphene.

As a method of synthesizing a two-dimensional boron sheet, for example, a method of decomposing diborane at high temperature is known (see, for example, Non Patent Literature 1).

CITATION LIST

Non Patent Literature

[Non Patent Literature 1]
Ultrathin Nanosheets: Ultrathin Single-Crystalline Boron Nanosheets for Enhanced Electro-Optical Performances, Junqi Xu, Yangyang Chang, Lin Gan, Ying Ma and Tianyou Zhai Advanced Science, 2 (2015) 1500023.

SUMMARY OF INVENTION

Technical Problem

However, in the related art, a production method for a two-dimensional boron compound-containing sheet, which consists of boron atoms and other atoms, and has high functionality, has not been established. Therefore, it was not possible to produce a two-dimensional boron compound-containing sheet.

The present invention has been made in view of the above circumstances, and an object thereof is to provide a two-dimensional hydrogen boride-containing sheet which has a two-dimensional network that consists of boron atoms and other atoms such as hydrogen, and a production method for a two-dimensional boron compound-containing sheet.

Solution to Problem

[1] A two-dimensional hydrogen boride-containing sheet, including:
a two-dimensional network that consists of $(HB)_n$ ($n \geq 4$).
[2] The two-dimensional hydrogen boride-containing sheet according to [1],
in which in the two-dimensional network, boron atoms are arranged in a hexagonal ring shape, hexagons formed of the boron atoms are connected to one another to form a mesh-like shape, and the two-dimensional network has a site at which two adjacent boron atoms amongst the boron atoms are bound to the same hydrogen atom.
[3] The two-dimensional hydrogen boride-containing sheet according to [1] or [2],
in which a length in at least one direction is 100 nm or longer.
[4] A production method for a two-dimensional boron compound-containing sheet, including:
a step of mixing, in a polar organic solvent, metal diboride having an $MB_2$-type (where M is at least one selected from the group consisting of Al, Mg, Ta, Zr, Re, Cr, Ti, and V) structure with an ion exchange resin in which ions exchangeable with metal ions constituting the metal diboride are coordinated.
[5] The production method for a two-dimensional boron compound-containing sheet according to [4],
in which the ion exchange resin has a sulfo group.
[6] The production method for a two-dimensional boron compound-containing sheet according to [4] or [5],
in which the polar organic solvent is acetonitrile or methanol.

Advantageous Effects of Invention

According to the present invention, it is possible to provide a two-dimensional hydrogen boride-containing sheet which has a two-dimensional network that consists of boron atoms and other atoms such as hydrogen, and can be used as an electronic material, a catalyst carrier material, a catalyst material, a superconducting material, or the like, and a production method for a two-dimensional boron compound-containing sheet.

DESCRIPTION OF EMBODIMENTS

Embodiments of the two-dimensional hydrogen boride-containing sheet and the production method for a two-dimensional boron compound-containing sheet of the present invention will be described.

The present embodiments are specifically described for better understanding of the spirit of the invention, and are not intended to limit the present invention unless otherwise specified.

[Two-Dimensional Hydrogen Boride-Containing Sheet]

The two-dimensional hydrogen boride-containing sheet of the present embodiment is a sheet having a two-dimensional network that consists of $(HB)_n$ (n≥4, where n is an integer). That is, in the two-dimensional hydrogen boride-containing sheet of the present embodiment, boron atoms (B) and hydrogen atoms (H) are present at a molar ratio of 1:1. In addition, the two-dimensional hydrogen boride-containing sheet of the present embodiment is a sheet having a two-dimensional network formed of only boron atoms (B) and hydrogen atoms (H).

In addition, in $(HB)_n$ (n≥4, where n is an integer), a case where n=4 represents a unit cell of the two-dimensional hydrogen boride-containing sheet of the present embodiment.

Figure 1A:
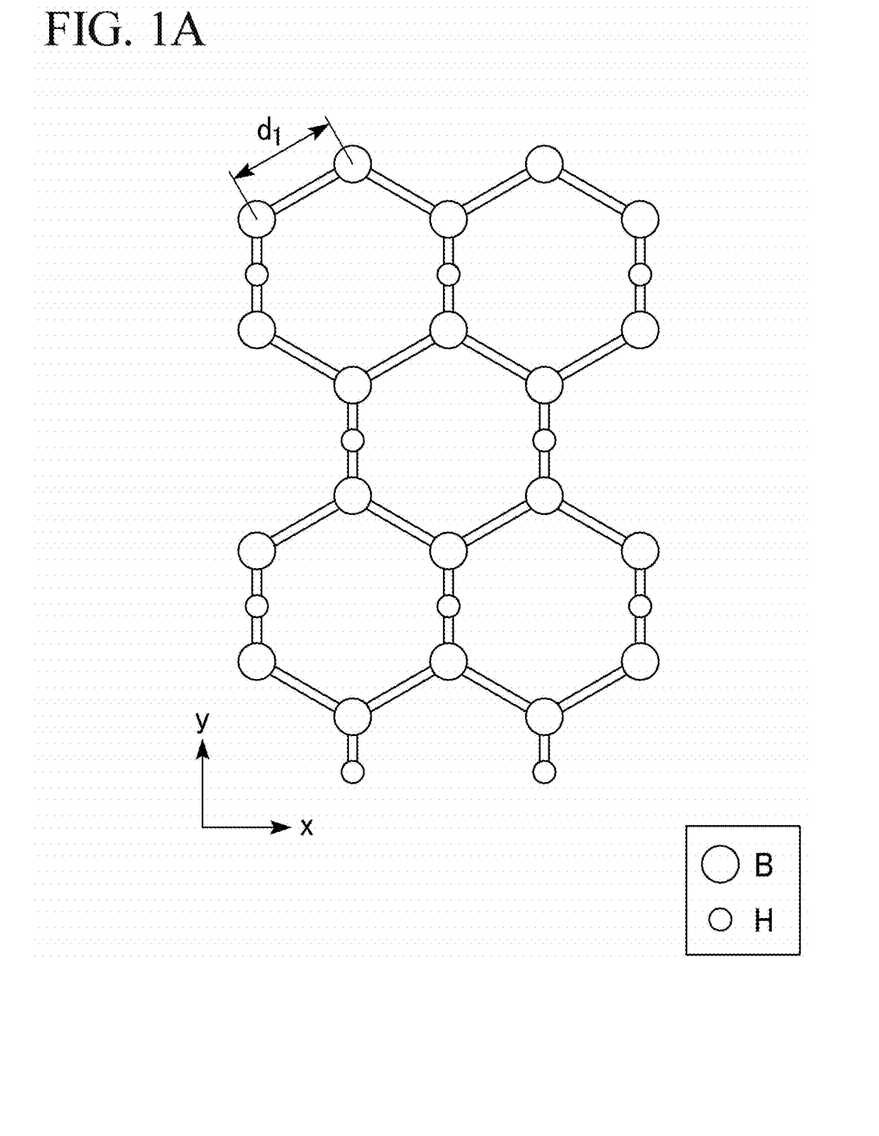
FIG. 1A is a schematic diagram representing an XY plane of a molecular structure of a two-dimensional hydrogen boride-containing sheet of the present invention.
Figure 1B:
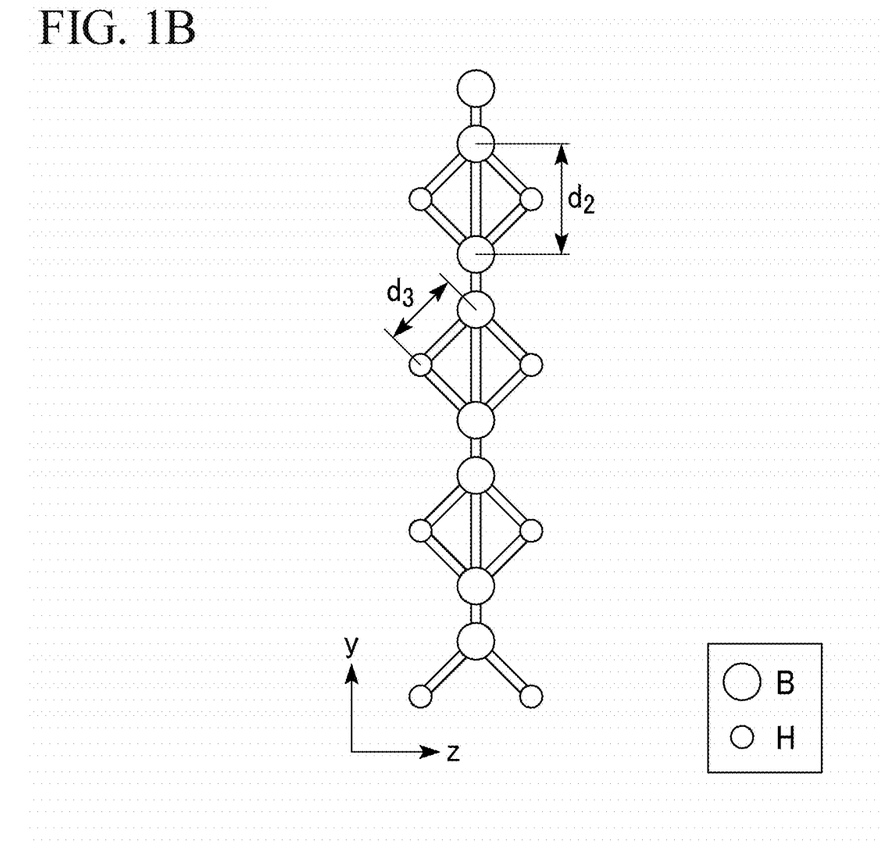
FIG. 1B is a schematic diagram representing a YZ plane of the molecular structure of the two-dimensional hydrogen boride-containing sheet of the present invention.
Figure 1C:
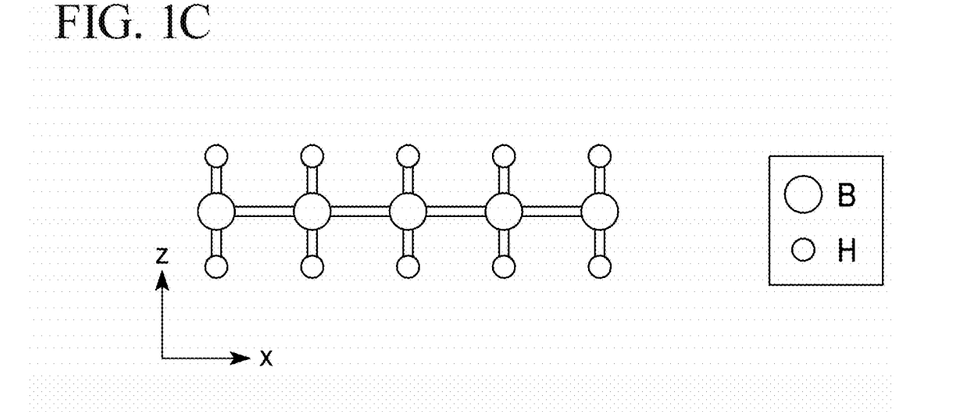
FIG. 1C is a schematic diagram representing a ZX plane of the molecular structure of the two-dimensional hydrogen boride-containing sheet of the present invention.

In the two-dimensional hydrogen boride-containing sheet of the present embodiment, boron atoms (B) are arranged in a hexagonal ring shape like a benzene ring, as shown in FIG. 1A. In addition, boron atoms (B) are present at the apexes of the hexagon. Furthermore, the hexagons formed of the boron atoms (B) are connected to one another without gaps to form a mesh-like surface structure (two-dimensional network). As shown in FIGS. 1B and 1C, the two-dimensional hydrogen boride-containing sheet of the present embodiment has a site at which two adjacent boron atoms (B) amongst the boron atoms are bound to the same hydrogen atom (H).

In the two-dimensional hydrogen boride-containing sheet of the present embodiment, a hexagonal mesh-like shape formed of the boron atoms (B) refers, for example, to a honeycomb shape.

Such a two-dimensional hydrogen boride-containing sheet of the present embodiment is a thin film-like substance having a two-dimensional network that consists of boron atoms (B) and hydrogen atoms (H). In addition, the two-dimensional hydrogen boride-containing sheet of the present embodiment contains almost no either metal atoms derived from metal diboride used in the production method for a two-dimensional boron compound-containing sheet of the present embodiment as will be described later, or other metal atoms.

In the two-dimensional hydrogen boride-containing sheet of the present embodiment, the total number of boron atoms (B) and hydrogen atoms (H) forming the above-mentioned mesh-like surface structure is 1,000 or more.

A bonding distance $d_1$ between two adjacent boron atoms (B) as shown in FIG. 1A is 0.17 nm to 0.18 nm. In addition, a bonding distance $d_2$ between two adjacent boron atoms (B) via one hydrogen atom (H) as shown in FIG. 1B is 0.17 nm to 0.18 nm. In addition, a bonding distance $d_3$ between adjacent boron atom (B) and hydrogen atom (H) as shown in FIG. 1B is 0.125 nm to 0.135 nm.

A thickness of the two-dimensional hydrogen boride-containing sheet of the present embodiment is 0.23 nm to 0.50 nm.

In the two-dimensional hydrogen boride-containing sheet of the present embodiment, a length in at least one direction (for example, a length in the X direction or Y direction in FIG. 1A) is preferably 100 nm or longer. In the two-dimensional hydrogen boride-containing sheet of the present embodiment, in a case where the length in at least one direction is 100 nm or longer, the two-dimensional hydrogen boride-containing sheet of the present embodiment can be effectively used as an electronic material, a catalyst carrier material, a catalyst material, a superconducting material, or the like.

A size (area) of the two-dimensional hydrogen boride-containing sheet of the present embodiment is not particularly limited. The two-dimensional hydrogen boride-containing sheet of the present embodiment can be formed in any size by the production method for a two-dimensional boron compound-containing sheet of the present embodiment as described later.

Such a two-dimensional hydrogen boride-containing sheet of the present embodiment is a substance having a crystal structure. In addition, in the two-dimensional hydrogen boride-containing sheet of the present embodiment, a strong bonding strength is exhibited between the boron atoms (B) forming the hexagonal ring and between the boron atom (B) and the hydrogen atom (H). Therefore, even if a plurality of the sheets containing two-dimensional hydrogen boride of the present embodiment are stacked to form a crystal (aggregate) at the time of production, the crystal can be easily cleaved along a crystal plane similarly to graphite and separated (recovered) as single-layer two-dimensional sheets.

The two-dimensional hydrogen boride-containing sheet of the present embodiment can be used as an electronic material, a catalyst carrier material, a superconducting material, or the like.

It is predicted that the two-dimensional hydrogen boride-containing sheet of the present embodiment exhibits an electronic structure called Dirac Fermion that exhibits the same mobility as graphene (see Two-Dimensional Boron Hydride Sheets: High Stability, Massless Dirac Fermions, and Excellent Mechanical Properties, Angew. Chem. Int. Ed., 2016, 55, 1.). Therefore, the two-dimensional hydrogen boride-containing sheet of the present embodiment is expected to be used as a new electronic device material.

In addition, a two-dimensional sheet of boron is predicted to be a superconductor at 10 K to 20 K (see Can Two-Dimensional Boron Superconduct?, Evgeni S. Penev, Alex Kutana, and Boris I. Yakobson, Nano Lett., 2016, 16, 2522). Therefore, the two-dimensional hydrogen boride-containing sheet of the present embodiment is expected to be used as a new matrix material for superconductors which exceeds the two-dimensional sheet of boron.

In addition, the two-dimensional sheet of boron is predicted to have four times mechanical strength of iron (see Mechanical properties and Stabilities of α-boron monolayers, Peng Q, Han L, Wen X, Liu S, Chen Z, Lian J, De S., Phys. Chem. Chem. Phys. 2015, 17, 2160). Therefore, the two-dimensional hydrogen boride-containing sheet of the present embodiment is expected to be used as a new matrix material for high-strength materials which exceeds the two-dimensional sheet of boron.

In addition, it is predicted that the surface of the two-dimensional sheet of boron can be coated with lithium to provide hydrogen storage characteristics of 12.3 mass % (Boron-double-ring sheet, fullerene, and nanotubes: potential hydrogen storage materials, Wang J, Zhao H Y, Liu Y., Chem. Phys. Chem. 2014, 15, 3453). Therefore, the two-dimensional hydrogen boride-containing sheet of the present embodiment is expected to be used as a new hydrogen storage material which exceeds the two-dimensional sheet of boron.

In addition, in a case where the two-dimensional sheet of boron is used for an electrode of a lithium ion secondary battery, it is predicted that the lithium ion secondary battery, provided with the electrode for which the two-dimensional sheet of boron is used, has four times the capacity of a lithium ion secondary battery provided with an electrode consisting of graphite (Borophene: A promising anode material offering high specific capacity and high rate capability for lithium-ion batteries, H. R. Jiang, Ziheng Lu, M. C. Wu, Francesco Ciucci, T. S. Zhao, Nano Energy 23 (2016) 97). Therefore, the two-dimensional hydrogen boride-containing sheet of the present embodiment is expected to be used as a new electrode material for lithium ion secondary batteries which exceeds the two-dimensional sheet of boron.

Furthermore, from the viewpoint that the two-dimensional sheet of boron releases hydrogen when heated (hydrogen comes out during burning thereof and explosion occurs due to hydrogen), the two-dimensional hydrogen boride-containing sheet of the present embodiment is expected to be used as a solid fuel.

[Production Method for Sheet Containing Two-Dimensional Boron Compound]

The production method for a two-dimensional boron compound-containing sheet of the present embodiment is a method, including a step of mixing (hereinafter referred to as "first step"), in a polar organic solvent, metal diboride having an $MB_2$-type structure (where M is at least one selected from the group consisting of Al, Mg, Ta, Zr, Re, Cr, Ti, and V) with an ion exchange resin in which ions exchangeable with metal ions constituting the metal diboride are coordinated.

As the metal diboride having an $MB_2$-type structure, metal diboride having a hexagonal ring structure is used. For example, aluminum diboride ($AlB_2$), magnesium diboride ($MgB_2$), tantalum diboride ($TaB_2$), zirconium diboride ($ZrB_2$), rhenium diboride ($ReB_2$), chromium diboride ($CrB_2$), titanium diboride ($TiB_2$), and vanadium diboride ($VB_2$) are used.

It is preferable to use magnesium diboride, from the viewpoint that ion exchange with an ion exchange resin can be easily performed in a polar organic solvent.

There is no particular limitation on the ion exchange resin in which ions exchangeable with metal ions constituting the metal diboride are coordinated. As such an ion exchange resin, for example, a polymer of styrene having a functional group in which ions exchangeable with metal ions constituting the metal diboride are coordinated (hereinafter referred to as "functional group α"), a polymer of divinylbenzene having the functional group α, a copolymer of styrene having the functional group α and divinylbenzene having the functional group α, and the like are mentioned.

As the functional group α, for example, a sulfo group, a carboxyl group, and the like are mentioned. Among these, a sulfo group is preferable, from the viewpoint that ion exchange with metal ions constituting the metal diboride can be easily performed in a polar organic solvent.

The polar organic solvent is not particularly limited. For example, acetonitrile, N,N-dimethylformamide, methanol, and the like are mentioned. Among these, acetonitrile is preferable from the viewpoint that no oxygen is contained.

In the first step, the metal diboride and the ion exchange resin are introduced into the polar organic solvent, and a mixed solution containing the polar organic solvent, the metal diboride, and the ion exchange resin is stirred, so that sufficient contact is made between the metal diboride and the ion exchange resin. As a result, ion exchange occurs between metal ions constituting the metal diboride and ions of the functional group α of the ion exchange resin, so that a two-dimensional boron compound-containing sheet is produced which has a two-dimensional network formed of boron atoms and atoms derived from the functional group α of the ion exchange resin.

For example, in a case where magnesium diboride is used as the metal diboride and an ion exchange resin having a sulfo group is used as the ion exchange resin, magnesium ion ($Mg^+$) of the magnesium diboride is replaced with hydrogen ion ($H^+$) of the sulfo group of the ion exchange resin, so that a two-dimensional hydrogen boride-containing sheet which has the two-dimensional network that consists of boron atoms (B) and hydrogen atoms (H) as described above is produced.

In the first step, it is preferable that an ion-exchange reaction between metal ions constituting the metal diboride and ions of the functional group α of the ion exchange resin be caused to proceed gently without applying ultrasonic waves or the like to the mixed solution.

In a case where the mixed solution is stirred, a temperature of the mixed solution is preferably 15° C. to 35° C.

A time for which the mixed solution is stirred is not particularly limited, and is, for example, 700 minutes to 7,000 minutes.

In addition, the first step is performed under an inert atmosphere consisting of an inert gas such as nitrogen ($N_2$) and argon (Ar).

Next, the mixed solution for which stirring has been completed is filtered (second step).

A filtration method of the mixed solution is not particularly limited, and, for example, methods such as natural filtration, vacuum filtration, pressure filtration, and centrifugal filtration are used. In addition, as a filter medium, for example, filter paper using cellulose as a base material, a membrane filter, a filter plate obtained by compression molding of cellulose, glass fiber, or the like, or the like is used.

A solution containing a product recovered by being separated from a precipitate through filtration is either naturally dried or dried by heating, to finally obtain only the product.

This product is a two-dimensional boron compound-containing sheet which has a two-dimensional network formed of boron atoms and atoms derived from the functional group α of the ion exchange resin.

As a method of analyzing the product obtained by the production method for a two-dimensional boron compound-containing sheet of the present embodiment, for example, observation by X-ray photoelectron spectroscopy (XPS), observation by a transmission electron microscope (TEM), observations by energy dispersive X-ray spectroscopy (EDS) and electron energy loss spectroscopy (EELS) performed in a transmission electron microscope, and the like are mentioned.

In X-ray photoelectron spectroscopy (XPS), for example, the surface of a product is irradiated with X-rays using an X-ray photoelectron spectrometer (trade name: JPS9010TR) manufactured by JEOL Ltd., and energy of photoelectrons generated at the time of irradiation is measured, thereby analyzing constituent elements of the product and electronic states thereof. In this analysis, in a case where energy of photoelectrons attributable to a metal element constituting the metal diboride which is a raw material is hardly detected, and only energy of photoelectrons attributable to boron and an element derived from the functional group α of the ion exchange resin is detected, it can be said that the product is composed only of boron and the element derived from the functional group α of the ion exchange resin.

In a case of the observation by a transmission electron microscope (TEM), for example, a shape (appearance) and the like of a product are analyzed by observing the product using a transmission electron microscope (trade name: JEM-2100F TEM/STEM) manufactured by JEOL Ltd. In this analysis, in a case where a film-like (sheet-like) substance is observed, it can be said that the product is a two-dimensional sheet-like substance. By performing energy dispersive X-ray spectroscopy (EDS) in a transmission electron microscope, it is possible to observe the presence or absence of a metal element at a TEM-observed site of the product. In this analysis, in a case where X-ray energy attributable to a metal element constituting the metal diboride which is a raw material is hardly detected, and a peak of the metal element (for example, Mg) does not appear, it can be said that the metal element does not exist. In addition, by performing electron energy loss spectroscopy (EELS) in a transmission electron microscope, constituent elements at a TEM-observed site of the product can be observed. In this analysis, in a case where only X-ray energy attributable to boron and an element derived from the functional group α of the ion exchange resin is detected, it can be said that the product is composed only of boron and the element derived from the functional group α of the above-mentioned ion exchange resin as described above.

According to the production method for a two-dimensional boron compound-containing sheet of the present embodiment, a two-dimensional boron compound-containing sheet which has a two-dimensional network formed of boron atoms and atoms derived from the functional group α of the ion exchange resin can be easily produced.

A two-dimensional boron compound-containing sheet having a larger area can be produced by using a large crystal of metal diboride having a $MB_2$-type structure which is a raw material.

In addition, according to the production method for a two-dimensional boron compound-containing sheet of the present embodiment, in order to perform ion-exchange between metal ions constituting the metal diboride and ions of the functional group α of the ion exchange resin, a polar organic solvent is used instead of using an acidic solution. Therefore, it is not necessary to adjust a pH of the mixed solution containing the polar organic solvent, the metal diboride, and the ion exchange resin.

In addition, according to the production method for a two-dimensional boron compound-containing sheet of the present embodiment, in the first step, for example, in a case where magnesium diboride is used as the metal diboride, and an ion exchange resin having a sulfo group is used as the ion exchange resin, magnesium ion ($Mg^+$) of the magnesium diboride is replaced with hydrogen ion ($H^+$) of the sulfo group of the ion exchange resin, so that a minimum unit $(HB)_4$ can be produced as the two-dimensional hydrogen boride-containing sheet.

EXAMPLES

Hereinafter, the present invention will be described more specifically with reference to experimental examples. However, the present invention is not limited to the following experimental examples.

Experimental Example 1

X-ray photoelectron spectroscopy (XPS) of magnesium diboride (manufactured by Rare Metallic Co., Ltd.) was performed.

Figure 2:
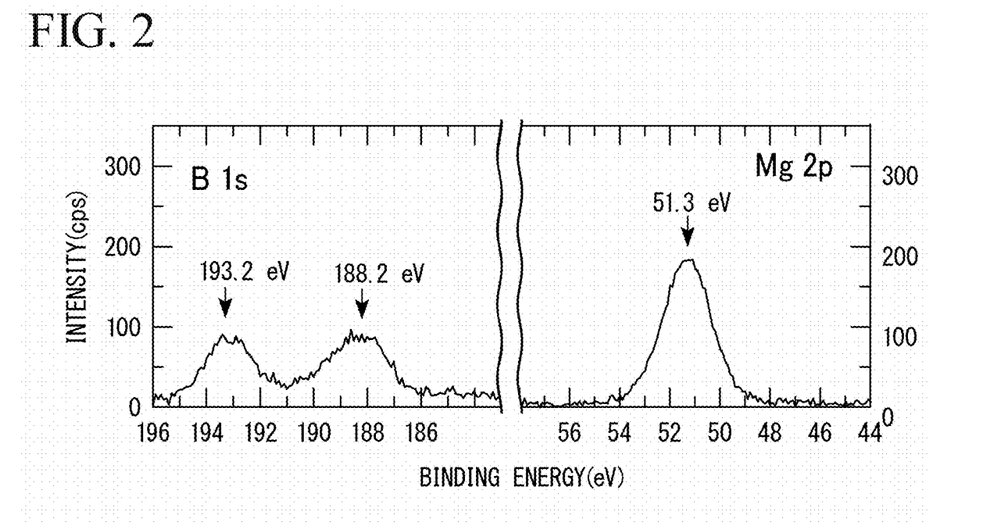
FIG. 2 is a graph representing the results of X-ray photoelectron spectroscopy in Experimental Example 1.

As an analyzer for the X-ray photoelectron spectroscopy, an X-ray photoelectron spectrometer (trade name: JPS9010TR) manufactured by JEOL Ltd. was used. The results of the X-ray photoelectron spectroscopy are shown in FIG. 2.

Experimental Example 2

30 mL by volume of ion exchange resin having a sulfo group (Amberlite (registered trademark) IR120B, manufactured by Organo Corporation) was added to acetonitrile while adding 60 mg of magnesium diboride (purity: 99%, manufactured by Rare Metallic Co., Ltd.). The resultant was stirred with a glass rod to prepare a mixed solution of the magnesium diboride and the ion exchange resin.

After the mixed solution was stirred at 25° C. for 72 hours, the mixed solution was filtered through a membrane filter with a pore size of 1.0 μm, and the filtrate was recovered. Thereafter, the filtrate was dried at 80° C. using a hot plate in a nitrogen atmosphere to obtain a product.

For the obtained product, X-ray photoelectron spectroscopy was performed in the same manner as in Experimental Example 1. The results are shown in FIG. 3.

In the results in FIG. 2, a peak of Mg2p of magnesium appears at 51.3 eV, a peak of B1s of boron appears at 188.2 eV, and a peak of boron oxide ($B_2O_3$) covering the surface of magnesium diboride ($MgB_2$) appears at 193.2 eV. This is consistent with the X-ray photoelectron spectroscopy results for typical commercial $MgB_2$.

Figure 3:
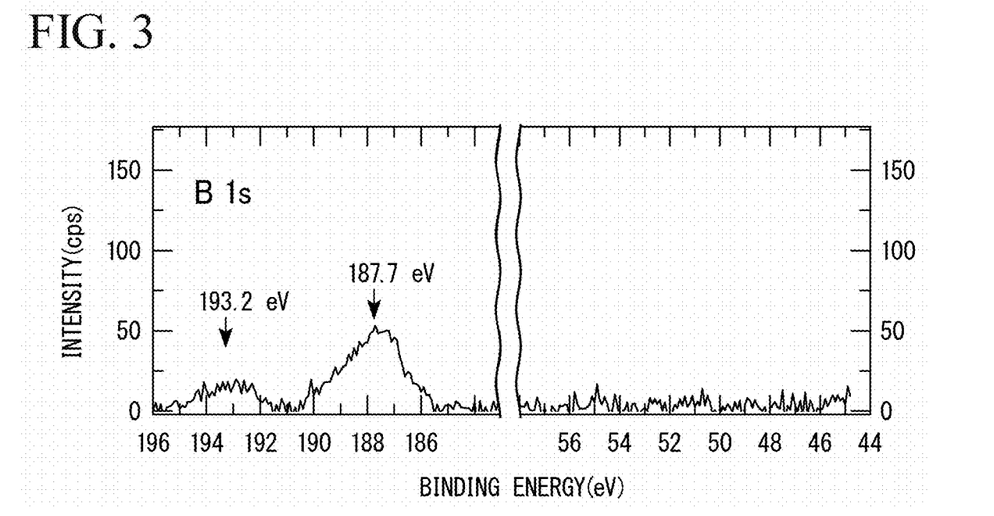
FIG. 3 is a graph representing the results of X-ray photoelectron spectroscopy in Experimental Example 2.
Figure 4:
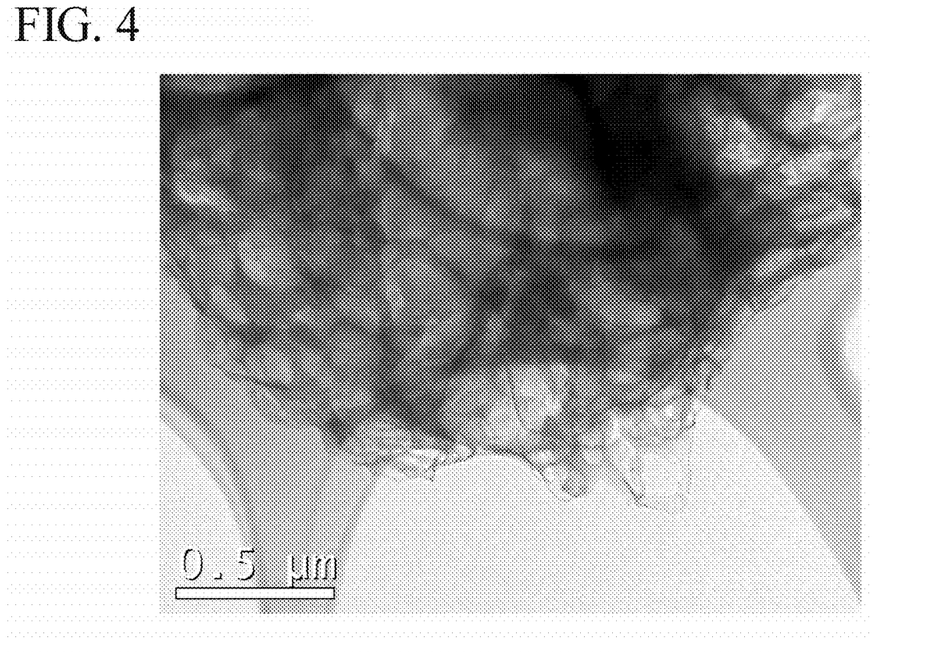
FIG. 4 is a scanning-type transmission electron microscopic image in Experimental Example 3.
Figure 5:
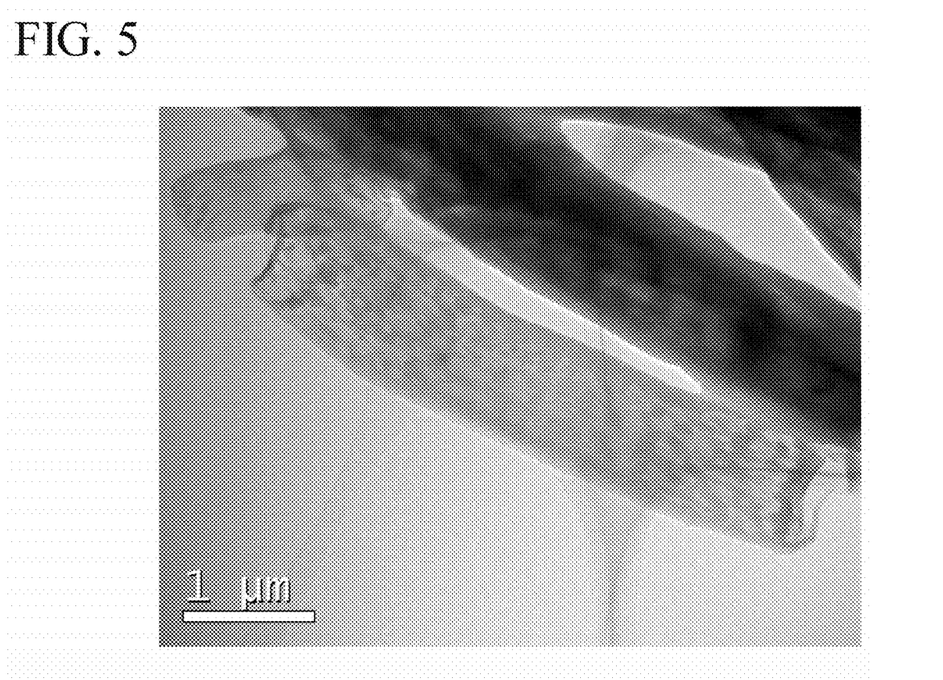
FIG. 5 is a scanning-type transmission electron microscopic image in Experimental Example 3.
Figure 6:
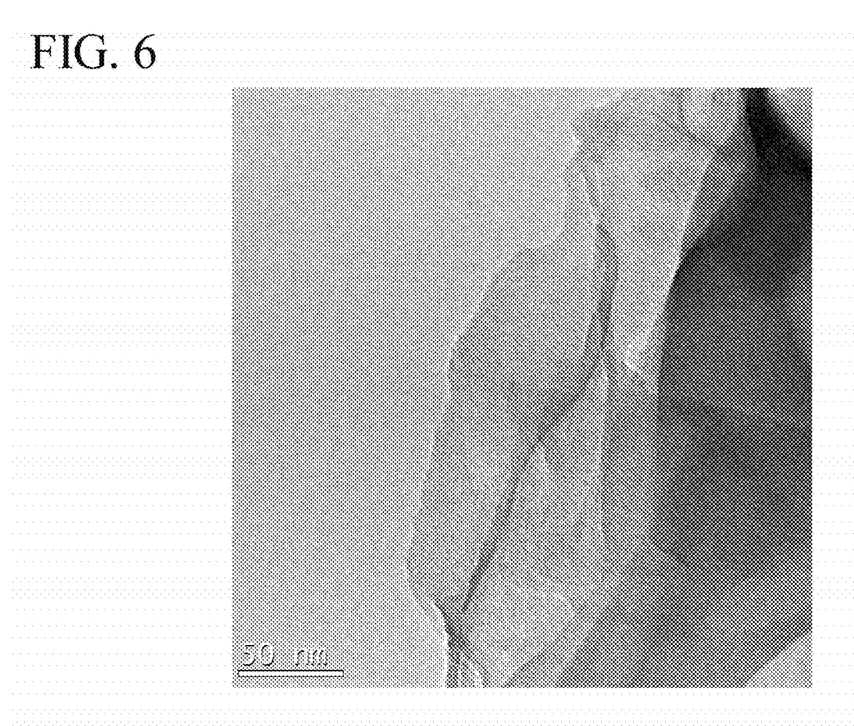
FIG. 6 is a scanning-type transmission electron microscopic image in Experimental Example 3.
Figure 7:
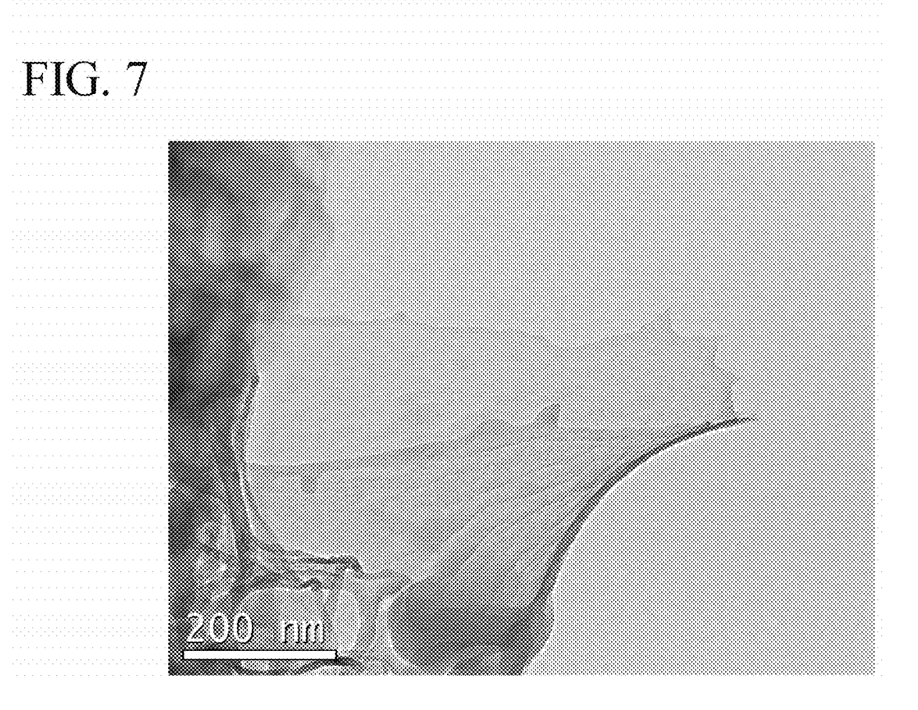
FIG. 7 is a scanning-type transmission electron microscopic image in Experimental Example 3.
Figure 8:
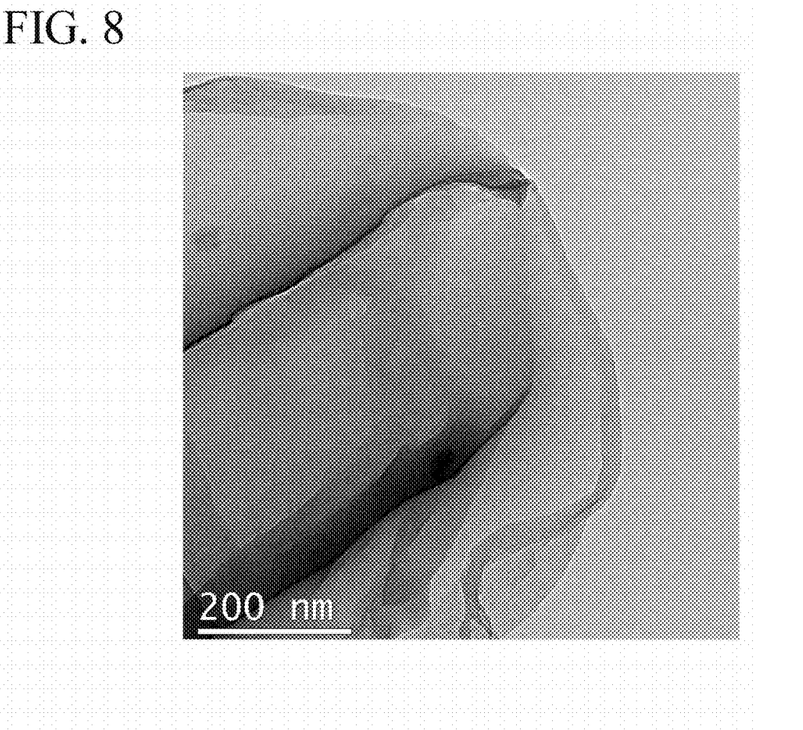
FIG. 8 is a scanning-type transmission electron microscopic image in Experimental Example 3.
Figure 9:
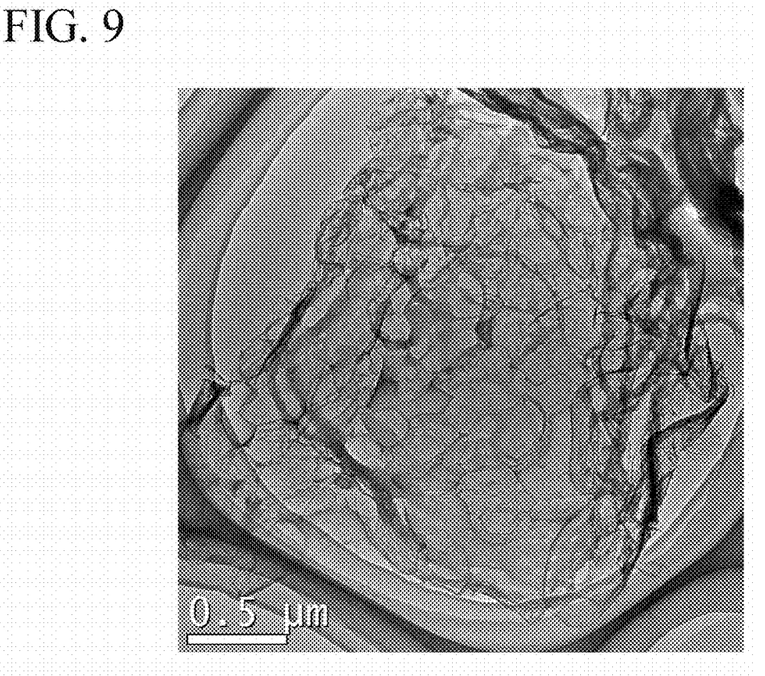
FIG. 9 is a scanning-type transmission electron microscopic image in Experimental Example 4.
Figure 10:
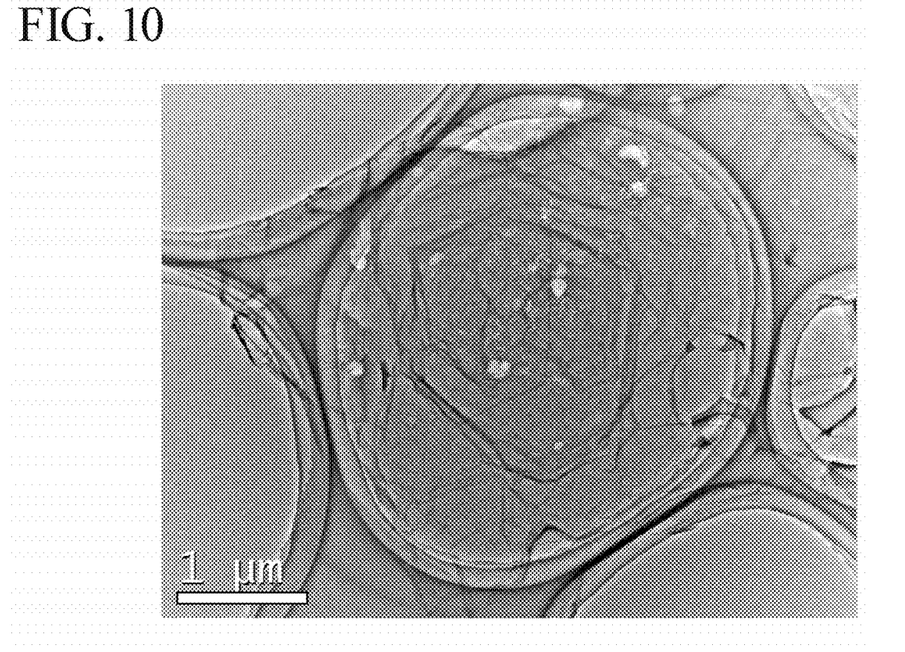
FIG. 10 is a scanning-type transmission electron microscopic image of Experimental Example 4.
Figure 11:
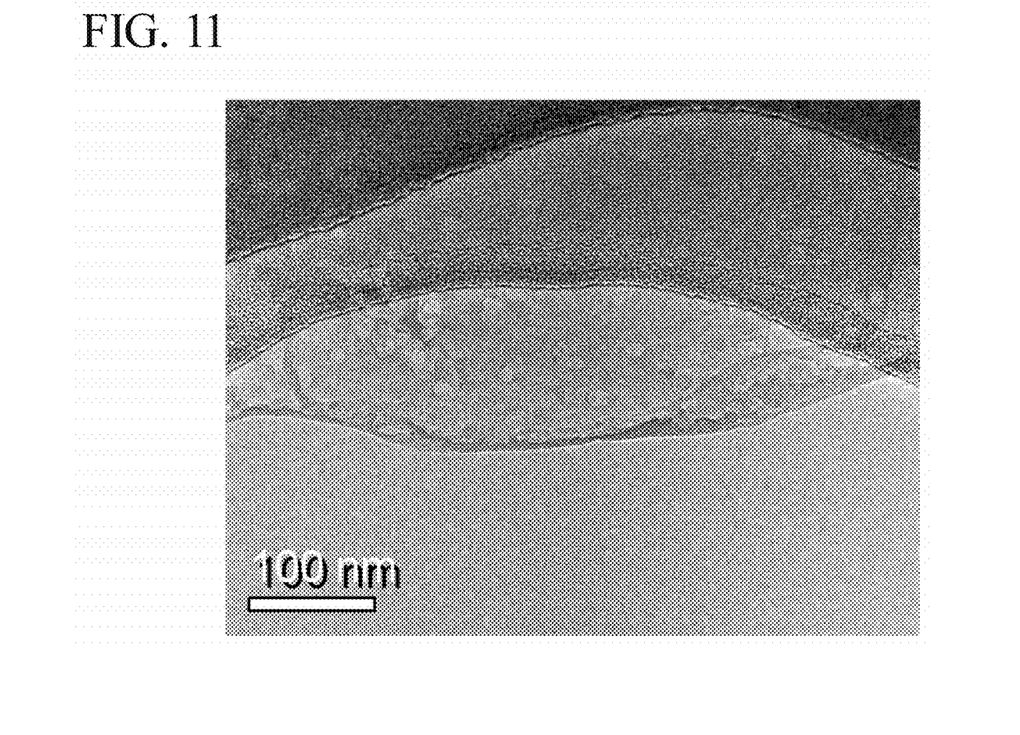
FIG. 11 is a scanning-type transmission electron microscopic image of Experimental Example 4.
Figure 12:
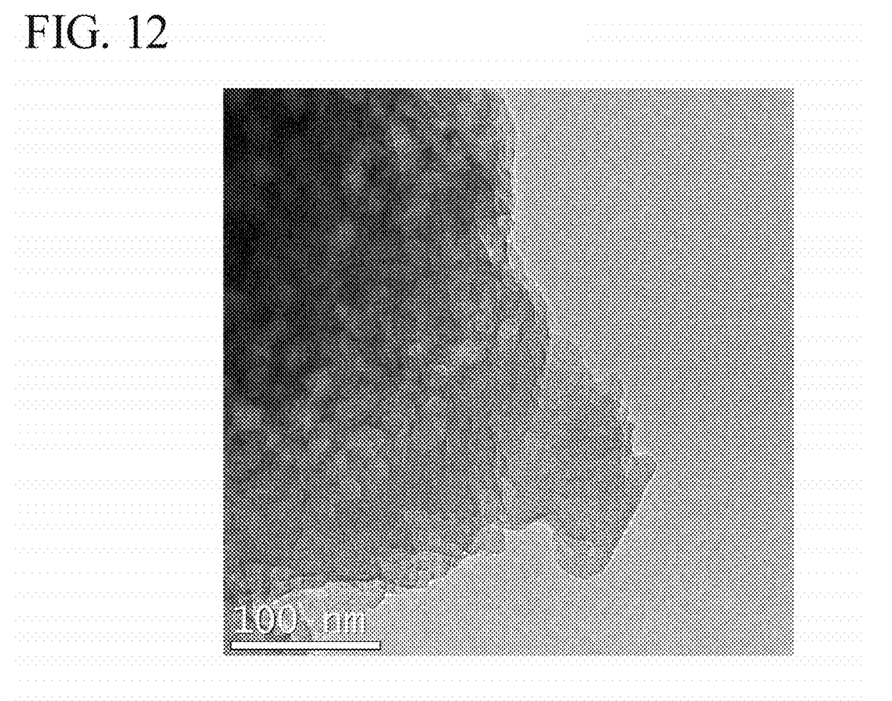
FIG. 12 is a scanning-type transmission electron microscopic image in Experimental Example 4.

From the results in FIG. 3, the peak of Mg2p which appears in FIG. 2 was not observed. As a result, it was found that the product in Experimental Example 2 contains no magnesium (Mg) and contains boron (B). In FIG. 3, the small peak appearing at 193.2 eV in FIG. 3 is a peak of boric acid which is a by-product. This result suggests that ion exchange has occurred between Mg ion of magnesium diboride ($MgB_2$) and hydrogen ion of the sulfo group of the ion exchange resin.

Experimental Example 3

For the product obtained in Experimental Example 2, an observation was performed with a scanning-type transmission electron microscope (trade name: JEM-2100F TEM/STEM) manufactured by JEOL Ltd. The observation results are shown in FIGS. 4 to 8.

From the results in FIGS. 4 to 8, it is considered that the obtained product forms two-dimensional sheets, and respective sheets are in a state in which they are peelable one by one.

Experimental Example 4

For the product obtained in Experimental Example 2 which had been subjected to heating at 200° C. for 60 minutes, an observation was performed with a scanning-type transmission electron microscope (trade name: JEM-2100F TEM/STEM) manufactured by JEOL Ltd. The observation results are shown in FIGS. 9 to 12.

From the results in FIGS. 9 to 12, it is considered that the obtained product forms two-dimensional sheets, and respective sheets are present in a state of being peelable one by one.

The product was subjected to heating at 200° C. for dehydration; and the product of Experimental Example 4 after being heated to 200° C. and the product of Experimental Example 3 are equal in terms of molecular structure.

Experimental Example 5

Figure 13:
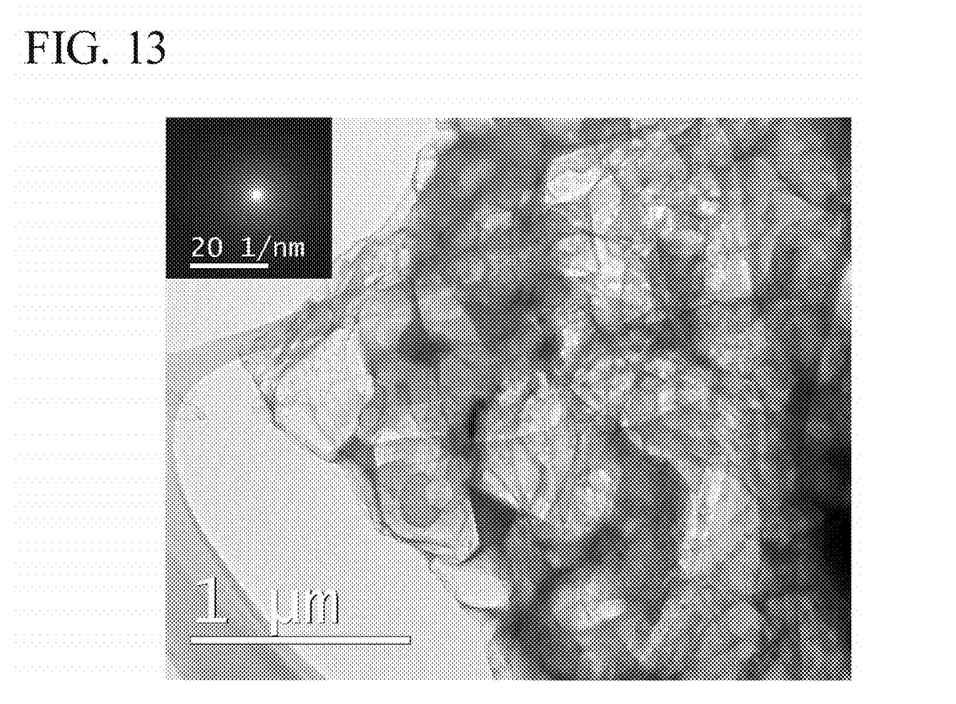
FIG. 13 is a scanning-type transmission electron microscopic image of Experimental Example 5.
Figure 14:
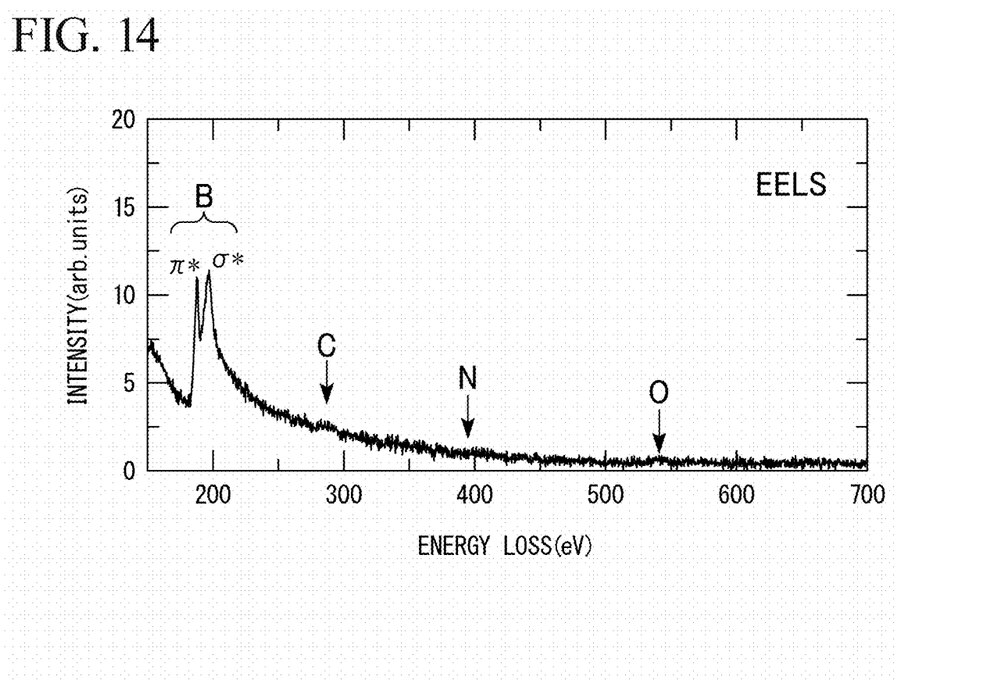
FIG. 14 is a graph representing the results of electron energy loss spectroscopy in Experimental Example 5.
Figure 15:
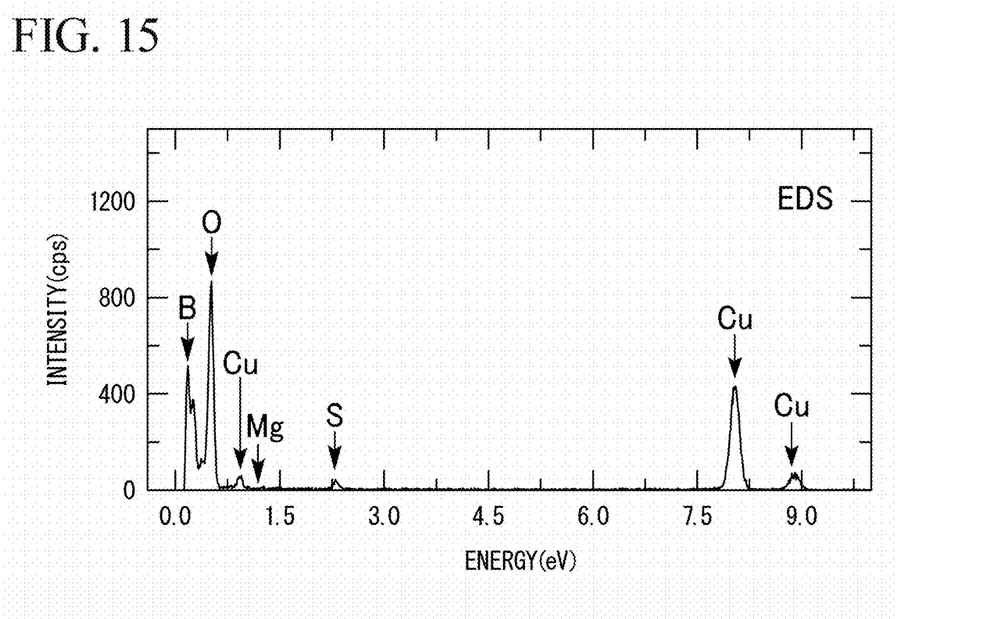
FIG. 15 is a graph representing the results of electron energy loss spectroscopy in Experimental Example 5.

For the product obtained in Experimental Example 2, an observation was performed with a scanning-type transmission electron microscope (STEM) (trade name: JEM-2100F TEM/STEM) manufactured by JEOL Ltd., and electron energy loss spectroscopy was performed. The observation results are shown in FIG. 13. In addition, the results of the electron energy loss spectroscopy regarding this product are shown in FIGS. 14 and 15. A sheet-like substance was observed from the results in FIG. 13. In addition, as shown in FIG. 14, a peak at 191 eV in the electron energy loss spectroscopy which represents the $sp^2$ structure of boron (B) was observed, and peaks attributable to carbon (C), nitrogen (N), and oxygen (O) were not observed. From this viewpoint, it was found that the sheet-like substance is composed only of boron having the sp2 structure. In addition, from the results in FIG. 15, no peak attributable to magnesium (Mg) was observed. From this viewpoint, it was found that the sheet-like substance is composed only of boron. In FIG. 15, peaks attributable to oxygen (O), sulfur (S), copper (Cu), and the like are observed. However, this represents noise due to high-sensitivity measurement.

Experimental Example 6

Figure 16:
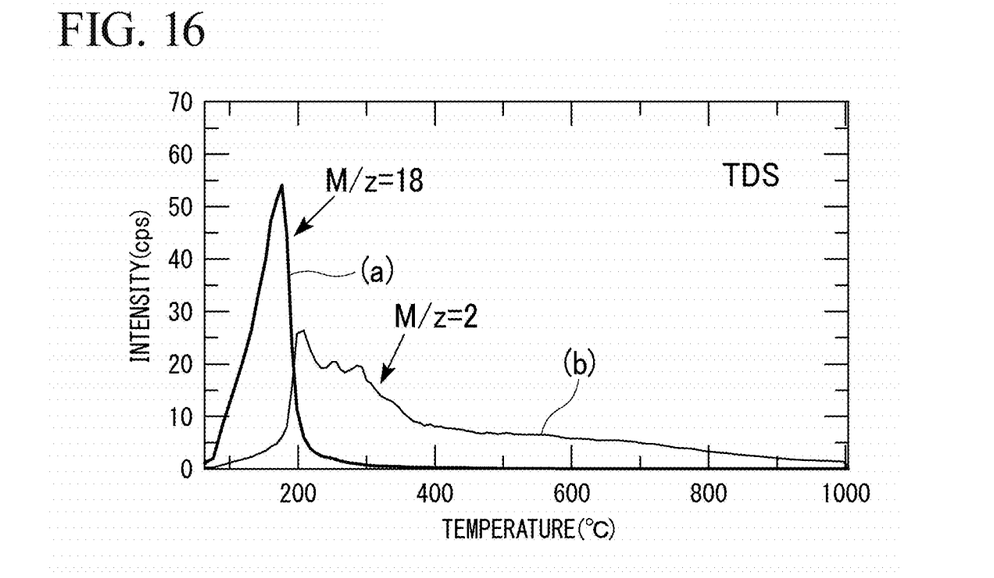
FIG. 16 is a graph representing the results of thermal desorption spectroscopy in Experimental Example 6.

For the product obtained in Experimental Example 2, thermal desorption spectroscopy (TDS) was performed with TDS1400TV manufactured by ESCO. The analysis results are shown in FIG. 16. In FIG. 16, (a) represents a spectrum attributable to water, and (b) represents a spectrum attributable to hydrogen. In a case where the product obtained in Experimental Example 2 is heated, it was found that water is eliminated at around 180° C. due to the presence of boron which is a by-product. In addition, in a case where the product obtained in Experimental Example 2 is further heated, it was found that hydrogen is eliminated at 200° C. or higher. An amount of water eliminated and an amount of hydrogen eliminated were measured, and a comparison was made for those amounts. As a result, a molar ratio of boron to hydrogen contained in the precipitate obtained in Experimental Example 2 was calculated to be 0.97:1. This result suggests that, in the precipitate obtained in Experimental Example 2, boron atom (B) and hydrogen atom (H) are present at a molar ratio of 1:1.

Experimental Example 7

Figure 17:
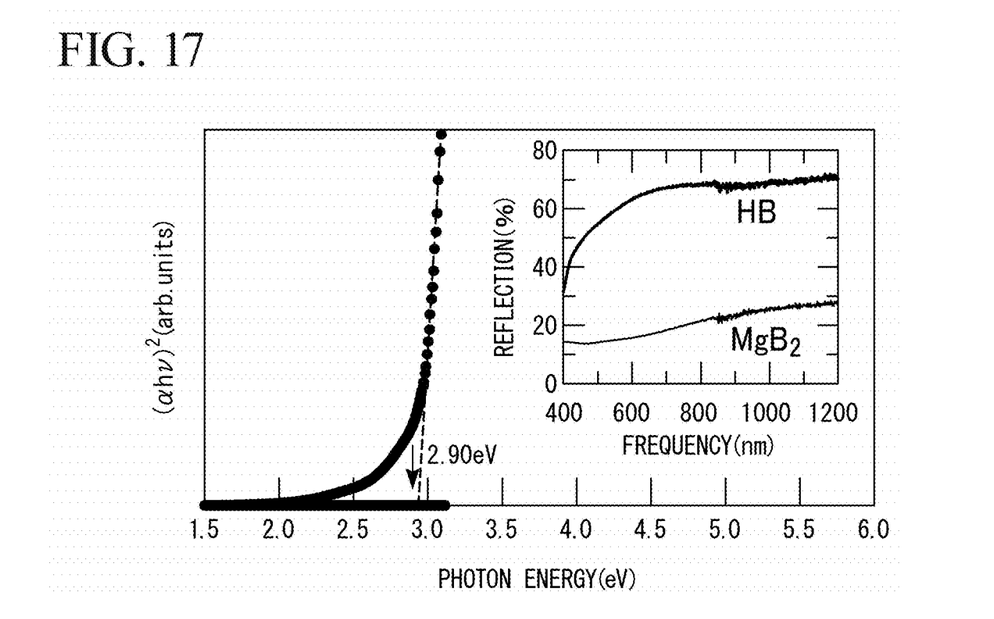
FIG. 17 is a graph representing the results of visible ultraviolet spectroscopy in Experimental Example 7.

For the product obtained in Experimental Example 2, visible ultraviolet spectroscopy (UV-VIS) was performed with V-660 manufactured by JASCO Corporation. The analysis results are shown in FIG. 17. From the results in FIG. 17, it was found that the product obtained in Experimental Example 2 has light absorption at 2.90 eV which is not present in magnesium diboride or boric acid.

Experimental Example 8

For the product obtained in Experimental Example 2, an observation was performed with a scanning-type transmission electron microscope (trade name: JEM-2100F TEM/STEM) manufactured by JEOL Ltd. The observation results are shown in FIG. 18.

Figure 18:
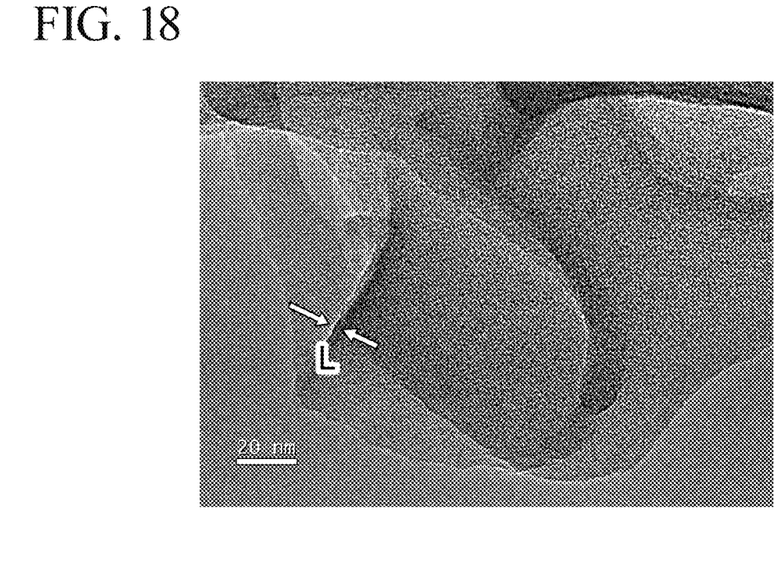
FIG. 18 is a scanning-type transmission electron microscopic image in Experimental Example 8.
Figure 19:
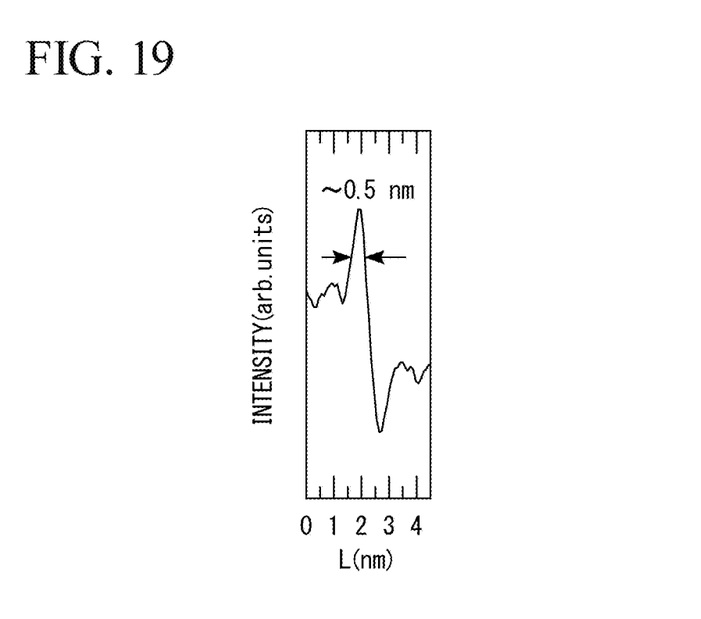
FIG. 19 is a graph representing the results obtained by measuring a thickness of a portion indicated by L in a scanning-type transmission electron microscopic image in Experimental Example 8.

In FIG. 18, a thickness of a portion indicated by L was measured by image analysis. The analysis results are shown in FIG. 19. From the results in FIG. 19, it was found that the product obtained in Experimental Example 2 is a sheet-like substance having a thickness of one to several atomic layers.

Experimental Example 9

Figure 20:
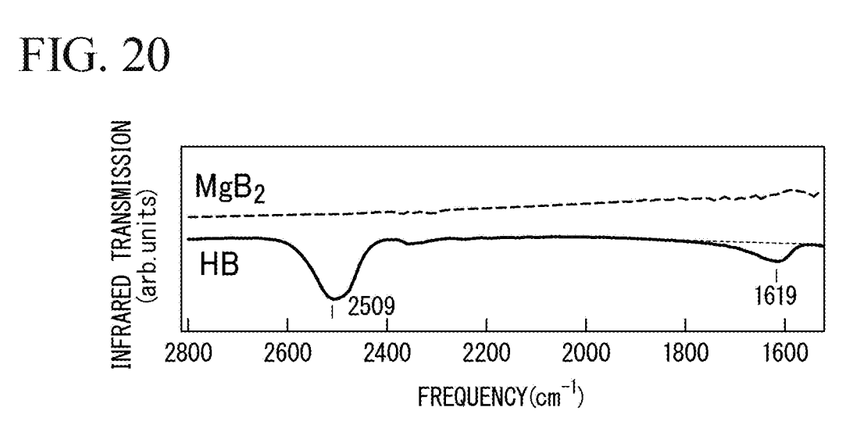
FIG. 20 is a graph representing the results of Fourier transform infrared spectroscopy in Experimental Example 9.

For the product obtained in Experimental Example 2, Fourier transform infrared spectroscopy (FTIR) was performed with FT/IR-300 manufactured by JASCO Analytical Instruments. The analysis results are shown in FIG. 20. From the results in FIG. 20, absorption at 1619 $cm^{-1}$ was almost identical to absorption at 1613 $cm^{-1}$ attributable to the theoretically calculated B—H—B bond. In addition, absorption at 2509 $cm^{-1}$ represents a defect site or boundary site of the two-dimensional hydrogen boride-containing sheet, or a termination structure thereof which is not present in an infinitely large two-dimensional hydrogen boride-containing sheet.

INDUSTRIAL APPLICABILITY

The two-dimensional hydrogen boride-containing sheet of the present invention can be used as an electronic material, a catalyst carrier material, a superconducting material, or the like.

The invention claimed is:
1. A two-dimensional hydrogen boride-containing sheet, comprising:
 a two-dimensional network that consists of $(HB)_n$ ($n \geq 4$), wherein in an X-ray photoelectron spectroscopy, a spectrum showing a peak attributable to B1s of a negatively charged boron of approximately 187.7 eV and no peak attributable to magnesium is obtained, in an electron energy loss spectroscopy, a spectrum showing a peak attributable to $sp^2$ structure of boron at approximately 191 eV is obtained, in a Fourier transform infrared spectroscopy, a spectrum showing an absorption attributable to a defect site, a boundary site or a termination structure of the two-dimensional hydrogen boride-containing sheet at approximately 2509 $cm^{-1}$ is obtained, and a molar ratio of boron to hydrogen determined from thermal desorption spectroscopy and measurement of mass of the two-dimensional hydrogen boride-containing sheet before and after heating the two-dimensional hydrogen boride-containing sheet is 1:1.

2. The two-dimensional hydrogen boride-containing sheet according to claim 1, wherein, in the two-dimensional network, boron atoms are arranged in a hexagonal ring shape, hexagons formed of the boron atoms are connected to one another to form a mesh-like shape, and the two-dimensional network has a site at which two adjacent boron atoms amongst the boron atoms are bound to the same hydrogen atom.

3. The two-dimensional hydrogen boride-containing sheet according to claim 1, wherein a length in at least one direction is 100 nm or longer.

4. A production method for a two-dimensional boron compound-containing sheet according to claim 1, the method comprising:

a step of mixing, in a polar organic solvent, metal diboride having an $MB_2$-type structure (where M is at least one selected from the group consisting of Al, Mg, Ta, Zr, Re, Cr, Ti, and V), with an ion exchange resin in which ions exchangeable with metal ions constituting the metal diboride are coordinated.

5. The production method for a two-dimensional boron compound-containing sheet according to claim 4, wherein the ion exchange resin has a sulfo group.

6. The production method for a two-dimensional boron compound-containing sheet according to claim 4, wherein the polar organic solvent is acetonitrile or methanol.

* * * * *